(12) United States Patent
Lee et al.

(10) Patent No.: US 6,287,937 B1
(45) Date of Patent: Sep. 11, 2001

(54) METHOD FOR SIMULTANEOUS DOPANT DRIVING AND DIELECTRIC DENSIFICATION IN MAKING A SEMICONDUCTOR STRUCTURE

(75) Inventors: Roger Lee; Fernando Gonzalez, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/619,777

(22) Filed: Jul. 20, 2000

Related U.S. Application Data

(63) Continuation of application No. 08/915,988, filed on Aug. 21, 1997, now abandoned.

(51) Int. Cl.[7] .................................................. H01L 21/76
(52) U.S. Cl. .......................... 438/424; 438/223; 438/433; 257/513
(58) Field of Search .................................. 438/223, 298, 438/424, 433; 257/513

(56) References Cited

U.S. PATENT DOCUMENTS

| | | | |
|---|---|---|---|
| 4,478,655 | 10/1984 | Nagakubo et al. | 438/151 |
| 4,713,329 | 12/1987 | Fang et al. | 437/29 |
| 4,929,565 | 5/1990 | Parrillo | 437/34 |
| 5,024,961 | 6/1991 | Lee et al. | 437/34 |
| 5,283,200 | 2/1994 | Okamoto | 437/29 |
| 5,420,061 | 5/1995 | Manning | 438/298 |
| 5,474,940 | 12/1995 | Tuskamoto | 438/221 |
| 5,547,894 | 8/1996 | Mandelman et al. | 437/56 |
| 5,767,000 | 6/1998 | Fulford, Jr. et al. | 438/433 |
| 5,786,262 | 7/1998 | Jang et al. | 438/424 |
| 5,795,801 | 8/1998 | Lee | 438/199 |
| 5,817,566 | 10/1998 | Jang et al. | 438/424 |
| 5,849,625 | 12/1998 | Hsue et al. | 438/424 |
| 5,854,121 | 12/1998 | Gardner et al. | 438/425 |
| 5,872,043 | 2/1999 | Chen | 438/424 |
| 5,885,887 | 3/1999 | Hause et al. | 438/564 |
| 5,981,355 | 11/1999 | Lee | 438/424 |
| 6,097,076 | 8/2000 | Gonzalez et al. | 257/513 |

OTHER PUBLICATIONS

Stanley Wolf Silicon Processing for the VSLI Era vol. 2 Lattice Press pp. 232–233 1990.

*Primary Examiner*—Chandra Chaudhari
*Assistant Examiner*—David S Blum
(74) *Attorney, Agent, or Firm*—Workman, Nydegger & Seeley

(57) ABSTRACT

The present invention relates to a well-drive process in which the process of well driving is carried out simultaneously with a densification cycle. The inventive method is particularly applicable to isolation trenches having widths at or below about 0.2 microns. The inventive method may be applied to other semiconductive structures of varying geometries.

21 Claims, 4 Drawing Sheets

METHOD FOR SIMULTANEOUS DOPANT DRIVING AND DIELECTRIC DENSIFICATION IN MAKING A SEMICONDUCTOR STRUCTURE

RELATED APPLICATIONS

This application is a continuation of U.S. Patent Application Ser. No. 08/915,988, filed on Aug. 21, 1997, now abandoned which is incorporated herein by reference.

BACKGROUND OF THE INVENTION

1. The Field of the Invention

The present invention relates to the formation of semiconductor devices. More particularly, the present invention relates to the fabrication of locally doped regions within a semiconductive substrate. In particular, the present invention relates to a method of controlling well-drive diffusion by combining well drive with densification of an isolation film on a semiconductive substrate.

2. The Relevant Technology

In the microelectronics industry, a substrate refers to one or more semiconductor layers or structures which include active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the microelectronics industry, the process of miniaturization entails shrinking the size of individual semiconductor devices and crowding more semiconductor devices into a given unit area. With miniaturization, problems of proper isolation between components arise.

When miniaturization demands the shrinking of individual devices, isolation structures must also be shrunk. Attempts to isolate components from each other are currently limited to photolithographic limits of about 0.2 microns for isolation structure widths.

To form an isolation trench, for example, by photolithography, the photoresist mask through which the isolation trench is etched generally utilizes a beam of light, such as ultraviolet (UV) light, to transfer a pattern through an imaging lens from a photolithographic template to a photoresist coating which has been applied to the structural layer being patterned. The pattern of the photolithographic template includes opaque and transparent regions with selected shapes that match corresponding openings and intact portions intended to be formed into the photoresist coating. The photolithographic template is conventionally designed by computer assisted drafting and is of a much larger size than a semiconductor substrate on which the photoresist coating is located. Light is shone through the photolithographic template and is focused on the photoresist coating in a manner that reduces the pattern of the photolithographic template to the size of the photolithographic coating and that develops the portions of the photoresist coating that are unmasked and are intended to remain. The undeveloped portions are thereafter easily removed.

The resolution with which a pattern can be transferred to the photoresist coating from the photolithographic template is currently limited in commercial applications to widths of about 0.2 microns or greater. In turn, the dimensions of the openings and intact regions of the photoresist mask, and consequently the dimensions of the shaped structures that are formed with the use of the photoresist mask, are correspondingly limited. Photolithographic resolution limits are thus a barrier to further miniaturization of integrated circuits. Accordingly, a need exists for an improved method of forming isolation trenches that have a size that is reduced from what can be formed with conventional photolithography.

The photolithography limit and accompanying problems of alignment and contamination are hindrances upon the ever-increasing pressure in the industry to miniaturize. Other problems that occur in isolation trench formation are, with trenches that are deep and wide in comparison to the size of the individual device that the trench is isolating, dielectric material such as thermal or deposited silicon oxide that fills the trench and tends to encroach upon the active area that the trench is designed to isolate. Another problem is that wide and deep trenches tend to put a detrimental amount of stress upon the silicon of the active area that leads to defects such as stress cracks, slip dislocations, and device failure.

Isolation trenches and active areas are often doped, either to enhance conductivity within an isolation area, such as an increased breakdown voltage at the bottom and/or in the walls of an isolation trench before filling the isolation trench with a dielectric material, or to increase the threshold voltage ($V_T$).

For the fabrication of a complimentary metal oxide silicon (CMOS) device, ion implantation to form a preferred breakdown voltage and a preferred $V_T$ has been implemented by patterning a mask to first protect, for example, the N-well side of the CMOS device and then to ion implant the N-well portion of the device. Following ion implantation of the selected site, the photoresist material must be removed and the CMOS device must be patterned with a second photoresist material that is substantially opposite from the previous photoresist material. After patterning of the second photoresist material, the complimentary side of the semiconductor structure is ion implanted. This first mask/second mask technique was required to prevent contamination by the wrong type of dopant in each side of the CMOS device.

The first mask/second mask process involved several steps including the major steps of spinning on a photoresist material; curing; aligning a photomask template; exposing the photoresist material; removing developed portions of the photoresist material so as to form a pattern in the photoresist material; etching a desired topography through the patterned photoresist material, for example an isolation trench; ion implanting, for example the isolation trench and upon an active area; removing the patterned photoresist material; and then performing essentially the same steps over again for the semiconductor structure in a scheme that is substantially opposite to the first photoresist material.

Such an operation involves several possible chances for an erroneous fabrication step that will lower overall production yield. For example, where an isolation trench was formed by an anisotropic etch, a portion of the first mask is mobilized to begin to line the recess formed by the anisotropic etch. In such a case, stripping of the first photoresist material may require a stronger stripping solution than would other wise be needed. During photoresist material mobilization, the mobilized photoresist material may combine with other exposed portions of the semiconductor structure, such as metals, and thereby form a metal-polymer film within the recess being formed. Such a metal-polymer film resists stripping with conventional stripping solutions. A more effective stripping solution that removes a metal-polymer film, however, will likely also cause effacement of preferred topographies of the semiconductor structure that will compromise its integrity of the semiconductor structure.

It is preferable, at some point in fabrication of the isolation trench, to densify the fill material of the isolation trench. Densification is desirable because it helps to prevent separation of materials in contact with the fill material. It is sometimes preferable to perform densification of isolation trench fill material immediately following its deposition. Depending upon the specific application, however, densification may be carried out at other stages of the process. For example, densification of fill material by rapid thermal processing (RTP) may make either etchback or planarization of the semiconductor structure more difficult. As such, it has been preferable to density later in the fabrication process, such as after a planarizing or etchback processing.

It is also preferable at one point in the fabrication process, to thermally "drive in" an implanted well such as an N-well in a P-doped substrate. An example of a prior art well drive process includes formation of a P-doped region in a semiconductive substrate by a P-type material implantation, and patterning the semiconductive substrate for an N-well pattern such as with a photoresist material. An N-well is then formed, for example, with an KeV or MeV implantation of N-type materials. The N-well pattern mask is then removed and a thermal well-drive process is then carried out under such conditions as 200° C. to 1,000° C., 2 to 12 hours, and in a nitrogen atmosphere within a furnace.

With the ever-increasing pressure upon the industry to miniaturize, thermal processing such as diffusive thermal well driving must be under increasingly stringent controls. Such thermal processing must be factored with greater care into the overall processing thermal budget. A well drive done early in the process may achieve a preferred amount of thermal diffusion of dopants, but further or not enough thermal processing will cause unwanted results. For example, encroachment of N-doping into areas that are designed to be semiconductor neutral will cause the structure to be semiconductive, resulting in higher stand by current device leakage.

What is needed in the art is a method of well driving that reduces the number of processing operations and thereby enhances yield. What is also needed is a more consolidated form of semiconductor fabrication in which control over the thermal budget is enhanced.

SUMMARY OF THE INVENTION

The present invention relates to a well-drive process in which the process of well driving is called out simultaneously with a densification cycle. The inventive method is particularly applicable to isolation trenches having widths at or below about 0.2 microns. However, the inventive method may be applied to other semiconductive structures of varying geometries.

According to a first embodiment of the present invention, a semiconductor structure may be formed with a semiconductive well within a semiconductive substrate. In a first preferred embodiment of the present invention, the semiconductor structure is blanket doped with a P-dopant material to form a substantially P-doped semiconductive substrate.

After further processing, the semiconductor structure is prepared for formation of an N-well. The semiconductor structure is patterned with a mask using, for example, a photoresist material. Following formation of the mask, ion implantation is implemented so as to form the N-well. Implantation of the N-well may be carried out according to known techniques.

Following implantation of the N-well, the mask is removed and the semiconductor substrate is prepared for formation of further structures. The formation of a nitride layer upon the upper surface of the semiconductive substrate includes forming it into a patterned nitride layer and forming a recess therein such as an isolation trench.

An optional process step may be carried out at this point in which further doping through the bottom of the recess may be carried out, either to enhance conductivity of the N-well or to enhance the isolation of the N-well caused by the recess through implantation of a P-dopant material.

Following optional additional implantation below the bottom of the recess, thermal oxidation of the exposed portion of the semiconductive substrate within the recess is carried out. Thermal oxidation forms a thermal oxide layer within the recess. The thermal oxide layer forms a first isolation film portion for this example of this embodiment.

A second oxide material is formed by formation of an isolation film, for example, by formation of oxide such as through the tetraethylorthosilicate (TEOS) decomposition process, the formation of borophosphosilicate glass (BPSG), and the like.

The semiconductor structure is subjected to a planarization process. Planarization is carried out before thermal processing to cause densification of the isolation film and expansion of the N-well. Planarization is preferably carried out before thermal processing because a densified film is usually more difficult to planarize than a film before densification.

The patterned nitride layer has formed therefrom a reduced height nitride layer with a planarized surface of the semiconductor structure that includes the reduced height nitride layer and the isolation film that is densified within the recess and that has formed a filled recess. Densification and well-drive processing have been carried out simultaneously.

Structures formed by the inventive method may include such configurations as an N-well in a P-substrate, a P-well in an N-substrate, and an N+ well in an N-substrate, or a P+ well in a P-substrate. It is to be understood herein that any of the aforementioned structures formed by the inventive method constitute a semiconductive substrate of a first semiconductivity type that has been patterned and implanted with a material to form a region of semiconductivity of a second semiconductivity type.

A second preferred embodiment of the present invention includes a blanket deposition of a P-dopant material into the semiconductive substrate.

Formation of a nitride layer is next called out, thus bypassing temporarily the formation of the N-well until a later stage in this embodiment of the inventive method. The nitride layer is patterned to from a patterned nitride layer without the presence of the N-well at this stage of this embodiment. Formation of a recess is next carried out, followed by optional formation of a thermal oxide layer, formation of an isolation film, and planarization of the isolation film and optionally a portion of the patterned nitride layer.

The next stage of this preferred embodiment of the inventive method includes formation of a mask has been deposited and patterned upon the planarized surface of the semiconductor structure. Formation of an N-well is next called out by an MeV doping of an N-dopant material through N-well mask.

Following the implantation of N-dopant materials to form the N-well, the process of densification of the isolation film and well-drive processing to expand the N-well into the expanded N-well are been carried out.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to a well-drive process in which the process of well driving is carried out simultaneously with a densification cycle. The inventive method is particularly applicable to isolation trenches having widths at or below about 0.2 microns. However, the inventive method may be applied to other semiconductive structures of varying geometries.

Figure 1:
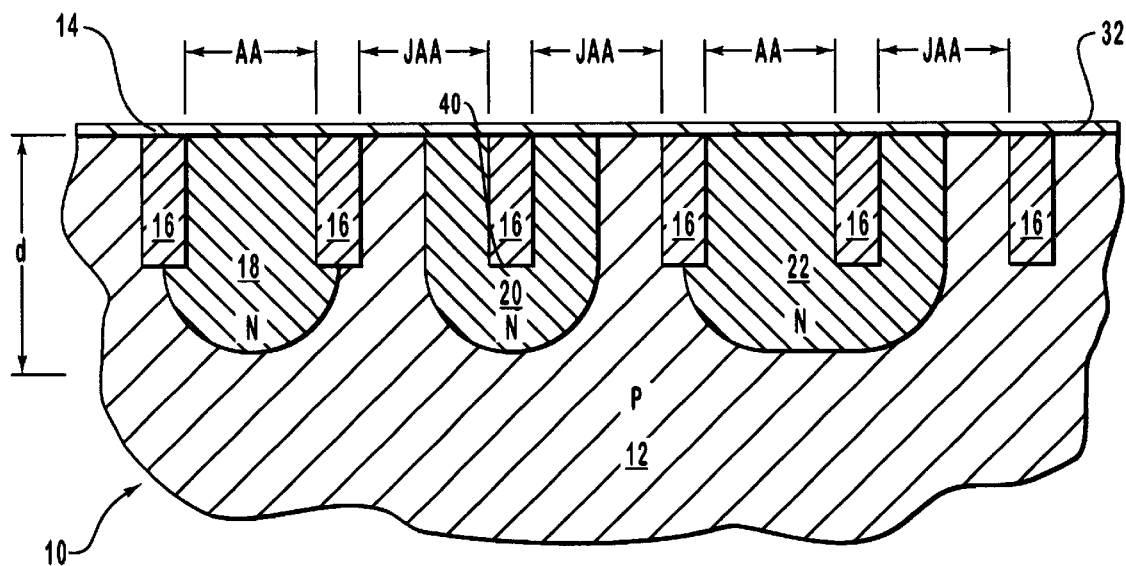
FIG. 1 is an elevational cross-section view of a semiconductor structure illustrating various types of dopant wells within a semiconductive substrate including an isolated well, a split well, and a multi-function well. The size of each well as illustrated is considered to be variable depending upon the degree of well-driving that has been carried out.

According to a first embodiment of the present invention, a semiconductor structure 10, as illustrated in FIG. 1, may be formed with a semiconductive well within a semiconductive substrate 12. As can be seen in FIG. 1, various well types may be formed within semiconductive substrate 12. For example, an isolated N-well 18 may be formed between two isolation structures 16. Another example is a split N-well 20 that substantially straddles a single isolation structure 16. Yet another example is a multiple-function N-well 22 that is terminated at one side with isolation structure 16, is substantially split with another isolation structure 16, and is terminated at another side with a distinct dopant gradient that changes from substantially N-doped to P-doped.

It can be seen in FIG. 1 that there are two types of active areas that may be formed below upper surface 32 of semiconductive substrate 12. Within isolated N-well 18, an active area of a single semiconductivity type is formed as indicated by the letters AA immediately above upper surface 32. In the center N-well of FIG. 1, it can be seen that split N-well 20 comprises an active area that contains a semiconductor junction of an N-doped region and a P-doped region to form a junction active area (JAA). The N-well at the right of FIG. 1 depicts a combination of an active area of a single semiconductivity type and a JAA. Yet a fourth possible configuration of an active area (not picture) comprises an N-well wherein a plurality of isolation structures are formed, and wherein a semiconductor junction such as an N-P region interface comprises each lateral boundary of the N-well.

It can be appreciated that various other structures that use a combination of isolation structure 16 and N-wells 18, 20, 22 may be formed according to the inventive method. For example the depth d of N-wells 18, 20, or 22, will depend upon implantation energy, implantation concentration, and well-drive intensity. An example of variation of split N-well 20 is an N-dopant depth, concentration, and well-drive intensity that would cause split N-well 20 to form substantially between the upper surface 32 of semiconductor structure 10 and the bottom 40 of isolation structure 16. This variation may be called out upon isolated N-well 18 and multiple-function N-well 22.

Figure 2:
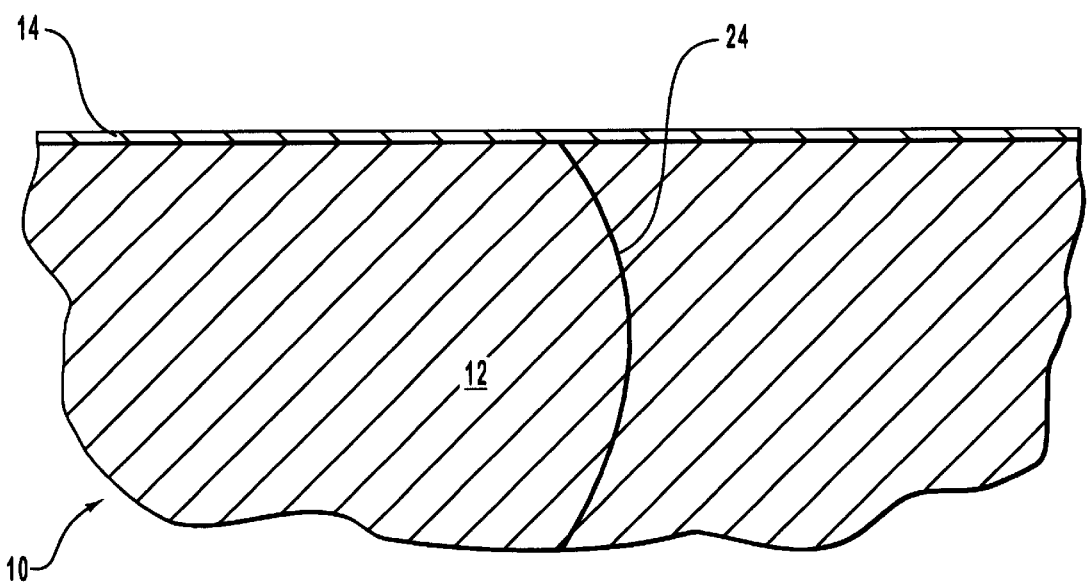
FIG. 2 is an elevational cross-section view of a semiconductor structure that is being subjected to the inventive process, wherein a P-doped semiconductive substrate has been blanket implanted with a P-dopant to form a blanket dopant profile therein.

In a first preferred embodiment of the present invention, semiconductor structure as illustrated in FIG. 2, is blanket doped with a P-dopant material to form a substantially P-doped semiconductive substrate 12. Blanket dopant profile 24 illustrates quantitatively the concentration amount of the P-dopant material within semiconductive substrate 12. The P-dopant material will preferably be implanted in a concentration range from about $1 \times 10^{12}$ atoms/cm$^3$ to about $1 \times 10^{15}$ atoms/cm$^3$, such as by single or multiple implantations.

Figure 3:
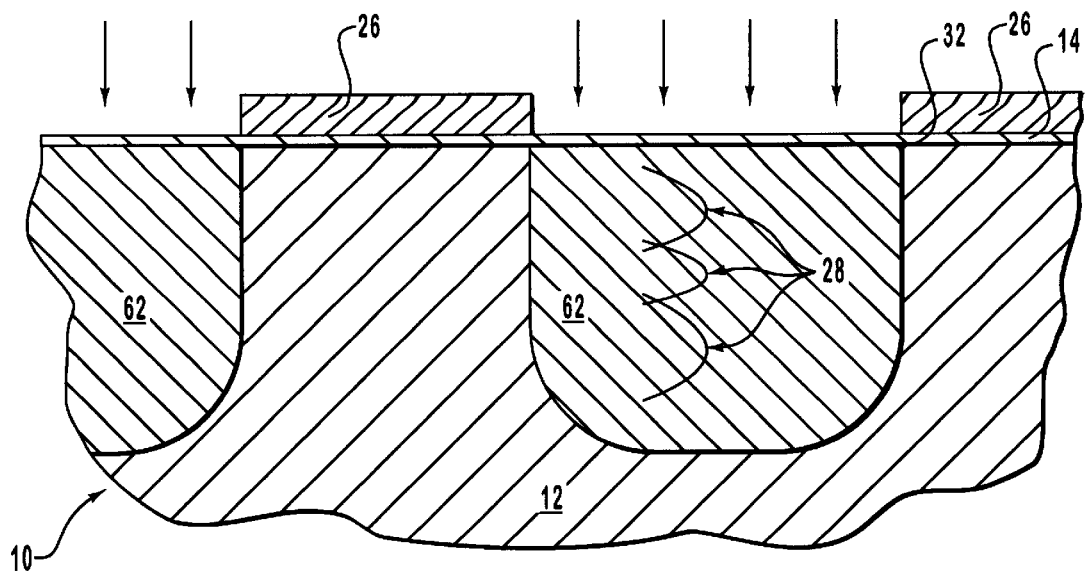
FIG. 3 is an elevational cross-section view of the semiconductor structure depicted in FIG. 2 after further processing according to the inventive method, wherein a mask has been patterned upon the semiconductor structure and ion implantation of N-doping materials is being carried out through exposed regions in the mask to form an N-well.

After further processing, semiconductor structure 10 as illustrated in FIG. 3 is prepared for formation of N-well 18, 20, or 22 (hereinafter referred to as N-well 62). Semiconductor structure 10 is patterned with a mask 26, for example, a photoresist material. Ion implantation with N-dopant material follows formation of mask 26 to form N-well 62. Implantation of N-well 62 may be carried out according to known techniques. For example, N-well 62 is illustrated in FIG. 3 as having been implanted by a series of at least three implantations to form well dopant concentration profiles 28 previous to a well-drive process. A dopant profile will be chosen by the semiconductor fabricator according to a specific application. The N-dopant material will preferably be implanted in a concentration range from about $1 \times 10^{12}$ atoms/cm$^3$ to about $1 \times 10^{15}$ atoms/cm$^3$.

Figure 4:
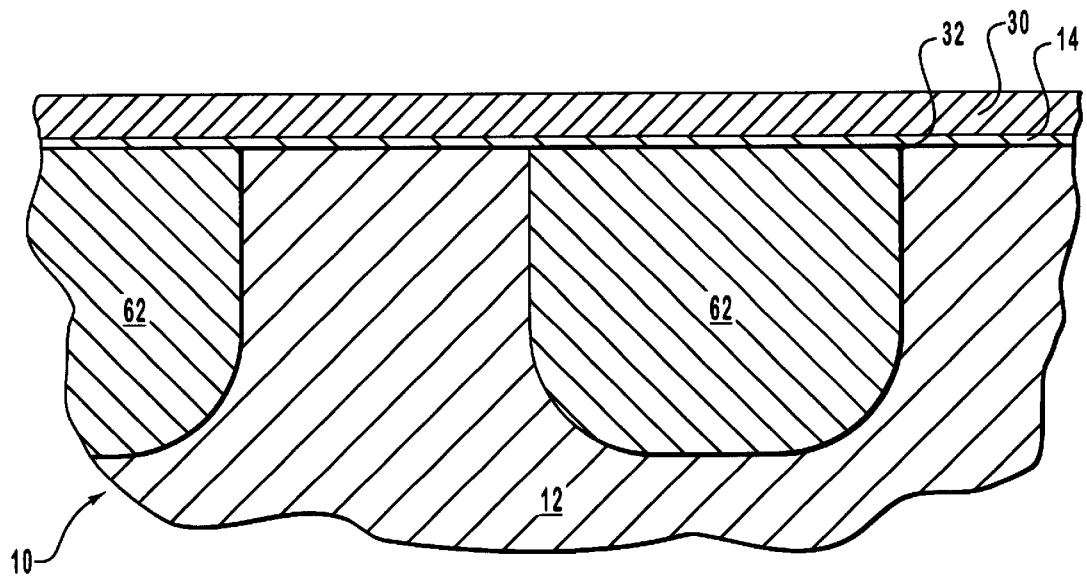
FIG. 4 is an elevational cross-section view of the semiconductor structure depicted in FIG. 3 after further processing, wherein the mask has been removed, and a nitride layer has been formed upon the upper surface of the semiconductor structure in preparation for further patterning and complimentary dopant implantation.
Figure 5:
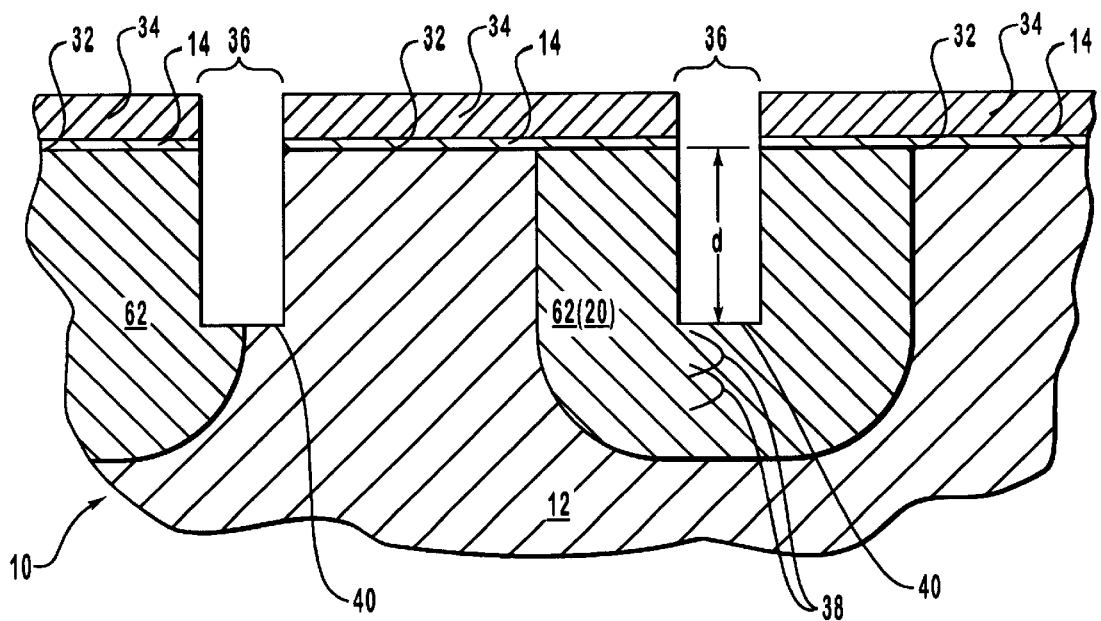
FIG. 5 is an elevational cross-section view of the semiconductor structure depicted in FIG. 4 after further processing, wherein the nitride layer has been patterned and etched to form at least one recess in the semiconductive substrate, and an optional second doping operation is carried out in order to extend insulative or conductive qualities below the recess through the N-well.

Following implantation of N-well 62, mask 26 is removed and semiconductor structure 10 is prepared for formation of further structures. FIG. 4 illustrates the formation of a nitride layer 30 upon upper surface 32 of semiconductive substrate 12. Nitride layer 30 is further processed as illustrated in FIG. 5, wherein a patterned nitride layer 34 and a recess 36, such as an isolation trench, have been formed. The choice of positioning of recess 36 within N-well 62 as illustrated in FIG. 5 has dictated that trench 32 on the right of FIG. 5 has caused N-well 62 to form split N-well 20.

An optional process step may be carried out at this point in which further doping through bottom 40 of recess 36 may be carried out, either to enhance conductivity of split N-well 20 or to enhance the isolation of split N-well 20 caused by recess 36 through implantation of a P-dopant material. It can been seen that recess bottom dopant profiles 38 are formed below bottom 40 of recess 36.

Figure 6:
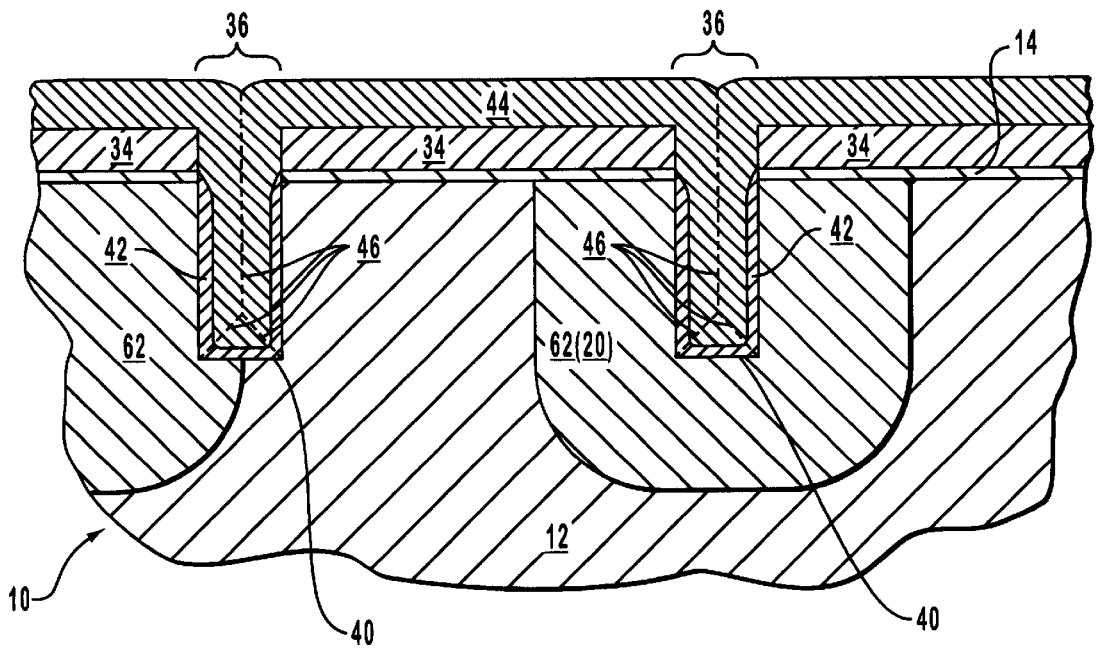
FIG. 6 is an elevational cross-section view of the semiconductor structure depicted in FIG. 5 after further processing, wherein thermal oxidation has been carried out to oxidize exposed portions of the semiconductive substrate, particularly within the recess, and wherein an oxide layer has been deposited upon the upper surface of the semiconductive substrate and within the recess to form a substantially continuous isolation film.

Following optional additional implantation below bottom 40 of recess 36, thermal oxidation of the exposed portion of semiconductive substrate 12 is carried out. Thermal oxidation forms a thermal oxide layer 42 within recess 36 as seen in FIG. 6. Thermal oxide layer 42 forms a first isolation film portion for this example of this embodiment.

A second oxide material is formed by formation of an isolation film, for example, by formation of oxide such as through the tetraethylorthosilicate (TEOS) decomposition process, the formation of borophosphosilicate glass (BPSG), and the like. It can been seen within FIG. 6 that an isolation film 44 has formed and a fill seam 46 has formed within isolation film 44 that is characteristic of filling a recess such as recess 36.

Alternative processing paths are available to the process engineer. For example, in one embodiment, thermal processing may now be carried out in which densification of isolation film 44 and expansion of N-well 62 are carried out simultaneously. However, the preferred embodiment of this processing alternative is depicted in FIG. 7.

Figure 7:
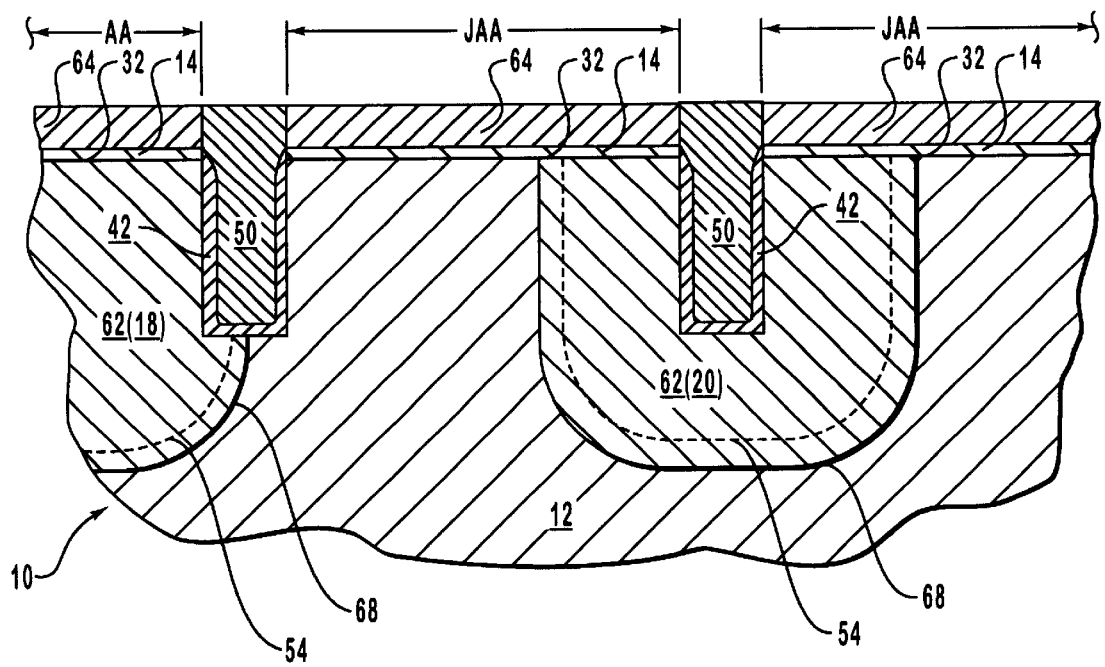
FIG. 7 is an elevational cross-section view of the semiconductor structure depicted in FIG. 6 after further processing, wherein the semiconductor structure has been planarized to remove substantially superficial portions of the isolation film and optionally at least a portion of the recess-pattered nitride layer, and in which the processes of densification and well-drive diffusion have been called out according to the inventive method.

Semiconductor structure 10 depicted in FIG. 6 is subjected to a planarization process to achieve semiconductor structure 10 depicted in FIG. 7. Planarization is carried out before thermal processing to cause densification of isolation film 44 and expansion of N-well 62. Planarization is preferably carried out before thermal processing because a densified film is usually more difficult to planarize than a film before densification.

It can be seen in FIG. 7 that planarization has substantially removed isolation film 44 above the level of patterned nitride layer 34 as depicted in FIG. 6. Patterned nitride layer 34, illustrated in FIG. 6, has formed a reduced height nitride layer 64 with a planarized surface 48 of semiconductor structure 10 that includes reduced height nitride layer 64 and isolation film 44 that is densified within recess 36 so as to form a filled recess 50. Densification and well-drive processing have preferably been carried out simultaneously.

It can be seen within FIG. 7 that split N-well 20 has formed an expanded well 52. A phantom line 54 illustrates the previous boundary of split N-well 20 before the well-drive process as depicted in FIG. 6.

Structures formed by the inventive method may include such configurations as an N-well in a P-substrate, and a P-well in an N-substrate, an N+ well in an N-substrate, or a P+ well in a P-substrate. It is to be understood herein that any of the aforementioned structures formed by the inventive method constitute a semiconductive substrate of a first semiconductivity type that has been patterned and implanted with a material to form a region of semiconductivity of a second semiconductivity type.

As an example of the first embodiment of the present invention, an N-well is formed within a P-type semiconductive substrate. The N-well comprises an active area and at least one isolation trench that has been filled with a dielectric material. FIG. 2 illustrates the first step in the process of this example, wherein boron is implanted within semiconductive substrate 12 to a preferred depth and of a preferred blanket dopant profile 24. Either before or after formation of blanket dopant profile 24, oxide layer 14 is optionally formed upon upper surface 32 of semiconductive substrate 12.

A photoresist material is spun on optional oxide layer 14 or upper surface 32 seen in FIG. 3 and cured. The photoresist material is exposed and patterned to form mask 26. Formation of N-well 62 is carried out by multiple implantations of N-type materials. In this example, a first implantation of phosphorus is carried out to form the lower dopant concentration profile of well dopant concentration profiles 28. Following implantation of phosphorus, a dual implantation of arsenic is carried out to form dopant concentration profiles making up the upper two profiles of well dopant concentration profiles 28. Implantation of phosphorus and arsenic is carried out under varying implantation energies, either in the KeV and MeV ranges. As referred to herein, a KeV range is an implantation energy in a range from about 25 KeV to about 600 KeV, and an MeV range is an implantation energy in a range from about 600 KeV to about 2800 keV.

FIG. 4 illustrates further processing of semiconductor structure 10 according to this example. Mask 26 has been removed and nitride layer 30 has been formed upon upper surface 32 of semiconductive substrate 12. Nitride layer 30 may be in a thickness range from about 500 Å to about 2,500 Å. A preferred thickness of nitride layer is about 1,000 Å. Nitride layer 30 is further processed as illustrated in FIG. 5 by spinning on a photoresist material, curing, aligning, exposing, and patterning the photoresist material. An anisotropic etch is then carried out in which etching substantially penetrates nitride layer 30, optional oxide layer 14, and penetrates into semiconductive substrate 12. Recess 36 is thereby formed.

The dimensions of recess 36 are dependent upon the specific application. In this example, a preferred width of recess 36 is in a width range from about 0.1 microns to about 0.3 microns, more preferably in a range from about 0.15 microns to about 0.25 microns, and most preferably in a range from about 0.18 microns to about 0.2 microns. In order to achieve dimensions in the more preferred range, the process engineer may alternatively select to deposit an anti-reflective coating upon nitride layer 30. Nitride layer itself may be antireflective, such as a refractory metal silicon nitride, e.g., a tungsten silicon nitride, a refractory metal nitride, e.g., a tungsten nitride, or a silicon nitride.

Recess 36 forms an isolation trench as illustrated in FIG. 5. The positioning of N-well 62 and recess 36 forms a JAA seen in the center of FIG. 5. Positioning of N-well 62 and recess 36 depends upon the specific application in which an active area or a JAA may be formed.

An optional process step is carried out at this point in which further doping through bottom 40 of recess 36 is carried out. Doping is carried out in order to enhance the insulative quality of recess 36 as it will ultimately form an isolation trench. Because recess 36 is formed within N-well 62, a P-dopant material such as boron is implanted to form recess bottom dopant profile 38. Implantation is carried out in two steps in order to achieve a preferred depth and concentration of boron that essentially neutralizes the semiconductive nature of N-well 62 immediately below bottom 40.

Following implantation below bottom 40 of recess 36, oxidation of exposed portions of semiconductive substrate 12 within recess 36 is carried out by thermal processing. FIG. 6 illustrates the result of thermal processing in order to form thermal oxide layer 42 within recess 36. Thermal oxide layer 42 is formed in order to prevent any undesirable contaminant that may be called in oxide materials that will ultimately form filled recess 50 as seen in FIG. 7. In FIG. 6, it can be seen that isolation film 44 has been formed upon semiconductor structure 10 to substantially fill recess 36. In this example, isolation film is formed through the decomposition of TEOS. Film seam 46 is shown, thus illustrating the substantially undensified nature of isolation film 44 at this state of the process.

Semiconductor structure 10 is subjected to a planarization process to achieve semiconductor structure 10 depicted in FIG. 7. Planarization is carried out by chemical-mechanical polishing (CMP), although simple etchback may also be used. CMP will preferably use a polishing solution that is substantially selective to nitride layer 30 over isolation film 44 by a factor in a range from about 10:1, more preferably in a range from about 5:1, and most preferably in a range from about 2:1. The process engineer may choose a preferred selectivity depending upon the required thickness of patterned nitride layer 34 for both before and after CMP.

It can be seen in FIG. 7 that CMP has substantially removed isolation film 44 above the level of patterned nitride layer 34. Patterned nitride layer 34 has formed reduced height nitride layer 64 with planarized surface of semiconductor structure 10. The quantity of reduced height nitrite layer 64 that has been removed compared to the original thickness of nitride layer 30 is about 80 percent the original thickness, more preferably about 50 percent the original thickness, most preferably about 35 percent the original thickness.

Densification of isolation film 44 and substantial elimination of film seam 46 as depicted in FIG. 7 is carried out in a manner that simultaneously accomplishes the well-drive process. Because arsenic diffuses less readily than phosphorus within N-well 62, the N-well profile 66 depicted in FIG. 7 may have a profile that is wider at the N-well bottom 68 than at upper surface 32. As illustrated in FIG. 7, both an active area and a JAA have been formed. Such a configuration will depend upon the application required by the process engineer.

A second preferred embodiment of the present invention is appropriately illustrated by reference to semiconductor structure 10 depicted in FIG. 2. A blanket deposition of a P-dopant material is carried out to form blanket dopant profile 24. Optionally, an oxide layer 14 may be formed to protect upper surface 32 of semiconductive substrate 12.

Formation of nitride layer 30 is next carried out, thus bypassing temporarily the formation of N-well 62 until a later stage in this embodiment of the inventive method. Nitride layer 30 is patterned to form patterned nitride layer 34 analogously illustrated in FIG. 5 without the presence of N-well 62. Formation of recess 36 is next carried out, followed by optional formation of thermal oxide layer 42, formation of isolation film 44, and planarization of isolation film 44 and optionally a portion of patterned nitride layer 34 to form optional reduced height nitride layer 64 and filled recess 50 as analogously depicted in FIG. 7 without the presence of N-well 62.

Figure 8:
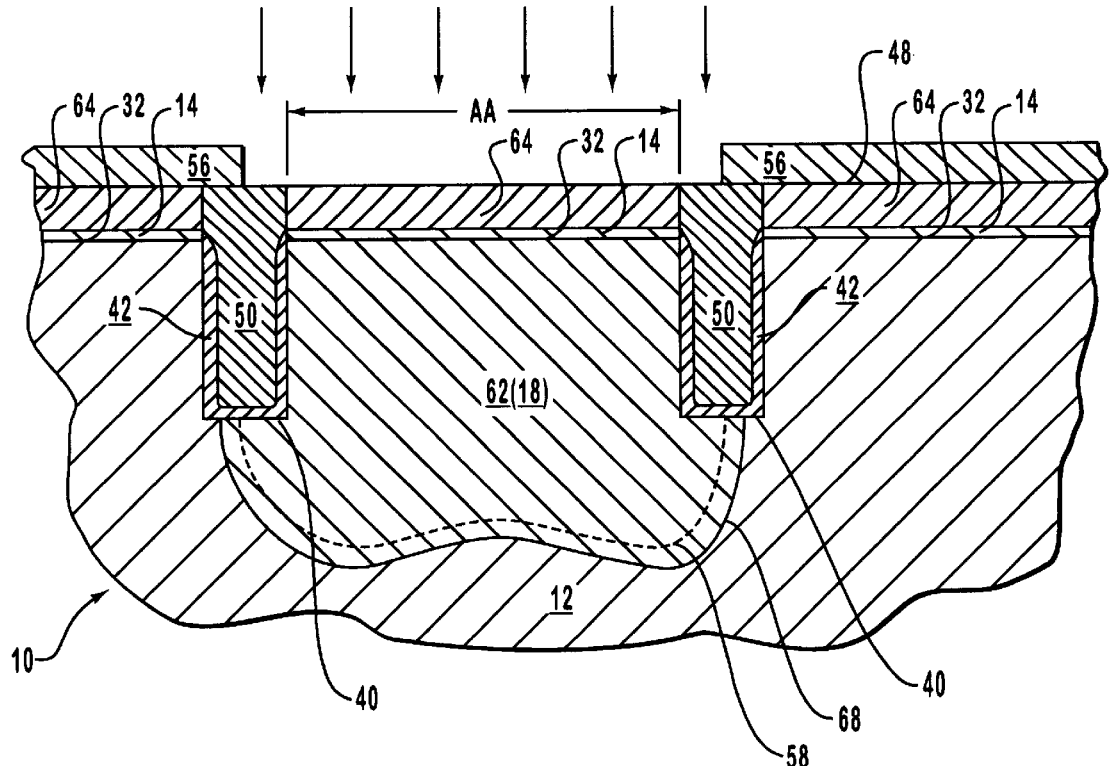
FIG. 8 is an elevational cross-sectional view of a semiconductor structure processed according to another preferred embodiment of the present invention, wherein implantation of N-well materials is called out after formation of a filled recess by patterning through the nitride layer and implantation of N-dopant materials through an N-well mask.

FIG. 8 appropriately depicts the next stage of this preferred embodiment of the inventive method. It can be seen that an N-well mask 56 has been deposited and is patterned upon planarized surface 48 of semiconductor structure 10. Formation of an N-well, for example isolated N-well 18, is next carried out by an MeV doping of an N-dopant material through N-well mask. A characteristic implantation boundary 58 can be seen in FIG. 8 as a phantom line wherein formation of isolated N-well 18 was called out by implantation through filled recess 50 to form a portion of isolated N-well 18, through reduced height nitride layer 64, oxide layer 14 and into semiconductive substrate 12 to form another portion of isolated N-well 18.

Following the implantation of N-dopant materials to form isolated N-well 18, the process of densification of isolation film 44 and well-drive processing to expand isolated N-well 18 into expanded N-well 52 have been carried out.

Removal of N-well mask 56 may be carried out simultaneously with thermal processing according to the inventive method, whereby N-well mask 56 is substantially driven off by the thermal energy used in the thermal processing step that simultaneously drives in N-well 62 and densifies isolation film 44 within filled recess 50.

As an example of the second embodiment of the present invention, a blanket deposition of a P-dopant material is carried out to form blanket dopant profile 24 seen in FIG. 2. The P-dopant material is boron. Oxide layer 14 is optionally formed by thermal processing, either before or after implantation of boron to form blanket dopant profile 24.

Nitride layer 30 is formed by chemical vapor deposition (CVD) of silicon nitride. Silicon nitride may be represented as $SiX_NY$, where Y is in a range from about 1 to about 6 and X is in a range from about 1 to about 3.

A photoresist material is spun on, cured, aligned, and exposed to form a pattern that will expose upper surface 32 of semiconductive substrate 12 in preparation for formation of recess 36 in the form of a trench. An anisotropic etch is carried out to form recess 36 in which nitride layer 32 is formed into patterned nitride layer 34, oxide layer 14 is removed according to the photoresist material, and recess 36 is formed into semiconductive substrate 12 to a desired depth d as seen in FIG. 5. Removal of the photoresist material may be called out by conventional methods. One alternative removal method is to thermally drive off the photoresist material and thereby simultaneously form thermal oxide layer 42 within exposed portions of semiconductive substrate 12 that form recess 36. Alternatively, the photoresist material may be chemically stripped and formation of thermal oxide layer 42 called out subsequently.

Following formation of thermal oxide layer 42, analogously illustrated in FIG. 6 without the presence of N-well 62 in the form of split N-well 20, isolation film 44 is formed by the decomposition of TEOS. Planarization of isolation film 44 and at least a portion of patterns nitride layer 34 is called out by CMP.

Planarized upper surface 48, illustrated in FIG. 8, is used as the upper surface for a photoresist material that is patterned to form N-well 62 in the form of isolated N-well 18. A photoresist material is spun on, cured, aligned, exposed, and patterned. Implantation of N-doping materials is called out first by MeV doping of phosphorus to a depth at or near the depth of bottom 40. A plurality of additional N-doping material implantations is carried out using arsenic at a depth between upper surface 32 and bottom 40. Depending upon the thickness of reduced height nitride layer 64, KeV implantation or preferably MeV implantation is carried out or the plurality of arsenic implantations. The plurality or arsenic implantations is preferably one to three, and is preferably two.

Following the implantation of N-dopant materials to form isolated N-well 18, the process of densification of isolation film and well-drive processing to expand isolated N-well 18 into expanded N-well 52 are carried out.

The inventive method has been demonstrated in two preferred embodiments and with examples during the formation of an isolation trench or a plurality thereof. The present invention also includes the method of combining the formation of an isolation structure such as a local oxidation of silicon (LOCOS) with the well-drive process. It can be appreciated that various other embodiments of the present invention may be contemplated by the process engineer, wherein the combination of well driving and a second thermal processing step are made.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of following a semiconductor structure comprising:
    providing a semiconductive substrate of a first semiconductivity type having an nitride layer thereover;
    forming a recess extending through the nitride layer and terminating within the semiconductive substrate;
    filling the recess with an dielectric material that projects out of the recess and above the nitride layer, said dielectric material being compositionally different than the material of the nitride layer;
    planarizing the dielectric material to form a top surface over the recess adjacent to the nitride layer;
    implanting through both the planarized dielectric material and the nitride layer a dopant of a second semiconductivity type to form a region of the second semiconductivity type in the semiconductive substrate; and
    increasing the density of the dielectric material while expanding the size of the region of the second semiconductivity type in the semiconductive substrate.

2. The method as defined in claim 1, wherein said expanding expands the region of the second semiconductivity type below the recess.

3. The method as defined in claim 1, wherein said expanding expands the region of the second semiconductivity type on opposite sides of the recess.

4. The method as defined in claim 1, wherein said expanding expands the region of the second semiconductivity type on only one of two opposite sides of the recess.

5. A method as defined in claim 1, wherein:
    filling the recess with said dielectric material forms a seam in the dielectric material within the recess; and
    said expanding eliminates said seam.

6. A method of forming a semiconductor structure comprising:
    providing a semiconductive substrate of a first semiconductivity type;
    forming an oxide layer upon the semiconductive substrate;
    forming a nitride layer upon the oxide layer;
    forming a recess extending through the nitride layer, past the oxide layer, and terminating at a bottom surface within the semiconductive substrate;
    filling the recess with an oxide material that projects out of the recess and above the nitride layer;
    planarizing the oxide material in the recess to form a top surface thereon that is co-planar with an adjacent top surface of the nitride layer;
    implanting through the nitride layer and the oxide material a dopant of a second semiconductivity type to form a region of the second semiconductivity is type in the semiconductive substrate; and
    increasing the density of the oxide material in the recess while expanding the size of the region of semiconductivity of the second semiconductivity type in the semiconductive substrate.

7. The method as defined in claim 6, wherein the size of the region of semiconductivity of the second semiconductivity type in the semiconductive substrate is expanded below the bottom surface of the recess.

8. A method of forming a semiconductor structure comprising:
    providing a semiconductive substrate of a first semiconductivity type;
    forming a nitride layer over the semiconductive substrate, said nitride layer having a planar top surface;
    forming a recess extending from the planar top surface of the nitride layer and terminating at a bottom surface within the semiconductive substrate;
    filling the recess with an oxide material that projects out of the recess and above the nitride layer;
    planarizing the oxide material to form a planar top surface immediately over the recess that is co-planar with the planar top surface of the nitride layer;
    bombarding the co-planar top surfaces of the oxide material and the nitride layer with a dopant to form a region of the second semiconductivity type in the semiconductive substrate, wherein the dopant that is implanted passes through:

the bottom surface of the recess; and the nitride layer;

increasing the density of the oxide material in the recess while expanding the size of the region of semiconductivity of the second semiconductivity type in the semiconductive substrate.

9. A method as defined in claim 8, wherein forming the recess in the semiconductive substrate includes anisotropically etching into said semiconductive substrate to form at least one isolation trench.

10. A method as defined in claim 8, wherein filling the recess includes filling the recess with silicon dioxide through a TEOS decomposition process.

11. A method as defined in claim 8, wherein:

filling the recess forms one or more seams in the oxide material within the recess; and increasing the density of the oxide material within the recess while expanding the size of the region of semiconductivity of the second semiconductivity type in the semiconductive substrate includes thermal densifying of the oxide material within the recess, whereby said one or more seams formed within the recess are eliminated.

12. A method as defined in claim 8, further comprising, prior to filling the recess with the dielectric material, forming a dielectric film upon a surface within the recess.

13. A method of forming a semiconductor structure according to claim 12, wherein forming the dielectric film upon the surface within the recess includes thermal oxidation of said semiconductive substrate.

14. A method of forming a semiconductor structure comprising:

providing a P-type silicon substrate;

thermally oxidizing the P-type silicon substrate to form a layer of silicon dioxide upon the P-type silicon substrate;

forming a layer of silicon nitride on the layer of silicon dioxide;

forming a planar top surface on the layer of silicon nitride;

anisotropically etching an isolation trench having sidewalls and bottom surface and extending through the planar top surface of the layer of silicon nitride, past the layer of silicon dioxide, and terminating at a bottom surface within the P-type silicon substrate;

oxidizing the P-type silicon substrate that define the isolation trench;

filling the isolation trench with a dielectric material that projects out of the isolation trench and above the planar top surface of the layer of silicon nitride;

forming a planar top surface on the dielectric material immediately over the isolation trench that is co-planar with the planar top surface of the layer of silicon nitride;

bombarding the co-planar top surfaces of the dielectric material and the layer of silicon nitride with an N-type dopant to form an N-type region in the P-type silicon substrate, wherein the N-type dopant passes through each of the dielectric material in the isolation trench;

the bottom surface of the isolation trench;

the nitride layer; and the layer of silicon dioxide;

heating the dielectric material and the P-type silicon substrate to increase the density of the dielectric material in the isolation trench while expanding the size of the N-type region in the P-type silicon substrate below the isolation trench.

15. A method as defined in claim 14, wherein the dielectric material filling the isolation trench is formed through a TEOS decomposition process.

16. A method as defined in claim 14, wherein:

filling the isolation trench forms one or more seams of the dielectric material within the isolation trench, and said heating eliminates said one or more seams.

17. A method of forming a semiconductor structure comprising:

providing a semiconductive substrate of a first semiconductivity type having an nitride layer thereover;

forming a first recess and a second recess each extending through the nitride layer and terminating within the semiconductive substrate;

filling the first and second recesses with a dielectric material that projects out of both said first and second recesses and above the nitride layer, said dielectric material being compositionally different than the material of the nitride layer;

planarizing the dielectric material to form a top surface over both said first and second recesses adjacent to the nitride layer;

implanting through both the planarized dielectric material and the nitride layer a dopant of a second semiconductivity type to form a region of the second semiconductivity type in the semiconductive substrate, and increasing the density of the dielectric material in both the first and second recesses while expanding the size of the region of the second semiconductivity type in the semiconductive substrate.

18. The method as defined in claim 17, wherein said expanding expands the region of the second semiconductivity type below both the first and second recesses.

19. The method as defined in claim 17, wherein said expanding expands the region of the second semiconductivity type to contact one side of the first recess and opposite sides of the second recess.

20. The method as defined in claim 17, wherein said expanding expands the region of the second semiconductivity type to contact both the first and second recesses.

21. A method as defined in claim 17, wherein:

filling the first and second recesses with said dielectric material forms a seam in the dielectric material within each of said first and second recessed, and said expanding eliminates each said seam.

* * * * *

UNITED STATES PATENT AND TRADEMARK OFFICE
CERTIFICATE OF CORRECTION

PATENT NO. : 6,287,937 B1
DATED : September 11, 2001
INVENTOR(S) : Roger Lee and Fernando Gonzalez It is certified that error appears in the above-identified patent and that said Letters Patent is hereby corrected as shown below:

Column 3,
Line 18, change "density" to -- densify --
Line 19, after "after" delete [a]
Line 27, after "with" change "an" to -- a --

Column 4,
Line 55, after "next" change "called" to -- carried --

Column 5,
Line 7, before "carried" delete [been]
Line 15, change "that" to -- to illustrate --

Column 6,
Line 54, before "comprises" change "picture)" to -- pictured) --
Line 63, before "variation" insert -- a --

Column 7,
Line 4, after "structure" insert -- 10 --
Line 43, before "seen" change "been" to -- be --

Column 8,
Line 56, after "2800" change "keV." to -- KeV. --

Column 9,
Line 11, change "Nitride" to -- The nitride --
Line 61, change "nitrite" to -- nitride --

Column 10,
Line 59, change "SiXNY" to -- $Si_xN_y$ --

Column 11,
Line 9, after "42" change "called" to -- carried --
Line 48, change "illustrated" to -- illustrative --
Line 62, before "dielectric" change "an" to -- a --

Column 12,
Line 40, after "semiconductivity" delete [is]

UNITED STATES PATENT AND TRADEMARK OFFICE
CERTIFICATE OF CORRECTION

PATENT NO.    : 6,287,937 B1
DATED         : September 11, 2001
INVENTOR(S)   : Roger Lee and Fernando Gonzalez It is certified that error appears in the above-identified patent and that said Letters Patent is hereby corrected as shown below:

Column 13,
Line 48, change "define" to -- defines --
Line 61, after "of" insert -- : --

Column 14,
Line 22, before "nitride" change "an" to -- a --
Line 39, after "semiconductive" change "substrate," to -- substrate; --
Line 57, after "second" change "recessed," to -- recesses; --

Signed and Sealed this

Seventh Day of May, 2002

Attest:

JAMES E. ROGAN
Attesting Officer          Director of the United States Patent and Trademark Office